United States Patent
Chen

(10) Patent No.: US 7,229,563 B2
(45) Date of Patent: Jun. 12, 2007

(54) PLASMA ETCHING OF NI-CONTAINING MATERIALS

(75) Inventor: Lee Chen, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/501,987

(22) PCT Filed: Jan. 28, 2003

(86) PCT No.: PCT/US03/00049

§ 371 (c)(1),
(2), (4) Date: Jun. 6, 2005

(87) PCT Pub. No.: WO03/065419

PCT Pub. Date: Aug. 7, 2003

(65) Prior Publication Data

US 2005/0211670 A1    Sep. 29, 2005

Related U.S. Application Data

(60) Provisional application No. 60/352,206, filed on Jan. 29, 2002.

(51) Int. Cl.
*C23F 1/00* (2006.01)

(52) U.S. Cl. .................. 216/13; 216/22; 216/67; 216/75; 438/710; 438/720; 438/742

(58) Field of Classification Search ............ None
See application file for complete search history.

(56) References Cited

U.S. PATENT DOCUMENTS

| | | | | |
|---|---|---|---|---|
| 4,723,903 A | * | 2/1988 | Okazaki et al. | 425/385 |
| 5,091,050 A | * | 2/1992 | Fujino et al. | 216/77 |
| 6,156,666 A | | 12/2000 | Tokushima | |
| 6,225,202 B1 | | 5/2001 | Gupta et al. | |
| 6,391,216 B1 | * | 5/2002 | Nakatani | 216/41 |
| 6,464,889 B1 | * | 10/2002 | Lee et al. | 216/37 |

FOREIGN PATENT DOCUMENTS

| | | | |
|---|---|---|---|
| JP | 51-022637 | | 2/1976 |
| JP | 53020769 A | * | 2/1978 |
| JP | 02-088782 | | 3/1990 |
| JP | 09205078 A | * | 8/1997 |
| JP | 2000-322710 | | 11/2000 |

* cited by examiner

*Primary Examiner*—Allan Olsen
(74) *Attorney, Agent, or Firm*—Oblon, Spivak, McClelland, Maier & Neustadt, P.C.

(57) ABSTRACT

An apparatus and method are described for etching Ni-containing films using gas phase plasma etching. Etching of Ti—Ni alloys is carried out by exposure to plasma comprising hydrogen halide (HX) and carbonyl etching gases. The Ti in the Ti—Ni alloy is etched via an ion-assisted reaction with HX and the Ni is etched by reacting with CO. The method is particularly well suited for anisotropic etching of Ti—Ni metal gates for CMOS applications. Etching of Ni—Fe layers is carried out by exposure to plasma comprising a carbonyl etching gas.

20 Claims, 9 Drawing Sheets

PLASMA ETCHING OF NI-CONTAINING MATERIALS

CROSS-REFERENCE TO RELATED APPLICATION

This application claims priority to U.S. provisional Ser. No. 60/352,206, filed on Jan. 29, 2002, the entire contents of which are herein incorporated by reference.

FIELD OF THE INVENTION

The present invention relates to gas phase plasma etching of Nickel (Ni) containing materials used in semiconductor applications.

BACKGROUND OF THE INVENTION

In the semiconductor industry, the minimum feature sizes of microelectronic devices are approaching the deep sub-micron regime to meet the demand for faster, lower power microprocessors and digital circuits. Process development and integration issues are key challenges for new gate stack materials and silicide processing, where the imminent replacement of $SiO_2$ with higher permittivity dielectric materials necessitates the use of alternative gate electrode materials to replace doped poly-silicon.

The introduction of metal gate electrodes to replace the traditional poly-silicon gates brings about several advantages. These advantages include elimination of the poly-silicon gate depletion effect, reduction in sheet resistance, better reliability and potentially better thermal stability on advanced high-permittivity gate dielectrics. One of the material selection criteria for the metal gate electrode is that the workfunction be adjustable. Control over the gate work-function is achieved by using a dual metal gate, since a metal alloy containing variable amounts of the metal constituents can yield an adjustable intermediate gate work function. From a processing point of view, the metal gate should be easily deposited by conventional techniques, such as CVD or sputtering, and be selectively etched by commonly used plasma etching processes. However, there are a number of processing difficulties in the dual metal gate approach. Etching characteristics of the different metal components are likely to be different, which can lead to etch rates that vary greatly from one metal to another, resulting in poor edge profiles and the need for complex manufacturing processes. Capacitively coupled plasma sources are widely used for dry etching processes to remove a layer of material from a wafer surface. At these small dimensions, etch uniformity and selectivity over the wafer surface has become increasingly more important, particularly when a layer is being etched according to a pattern. When manufacturing circuits with advanced feature sizes, anisotropic etching methods are needed that allow excellent control over the etching process. This is achieved using ion-assisted etching processes that comprise a strong physical component in addition to a chemical component. The chemical component conventionally involves a mixture of process gases that react with the substrate and form a reaction layer on the substrate. The physical component involves subsequent direct line-of-sight impaction of gas phase ions on the surface that results in physical desorption of the reaction products from the surface and material removal. The reaction (passivation) layer on the sidewalls of high-aspect-ratio structures receives low levels of ion bombardment, resulting in slow etching of the sidewalls, which leads to anisotropic etching profiles.

Potential Ni-containing materials for use as metal gates include Ti—Ni dual metal alloys. Ti—Ni alloys are known to be thermally stable, which allows them to be used at the high temperatures that are necessary for source/drain implant activation. Etching of Ti- and Ni-containing materials has been carried out using halogen-based chemistry, but halogen plasma etching of Ni is difficult, in part since Ni-halide etching products (e.g., $NiBr_2$, $NiCl_2$ or $NiI_2$) have very low vapor pressures and high process temperatures ($>200°$ C.) are needed for ion-assisted etching of the Ni-halide reaction products. The high temperature requirement along with potential redeposition of the Ni-halide etching products on to the chamber hardware imposes serious restrictions on the reliability and productivity of the etching chamber hardware. Removal of Ni-halide etching products is possible at low temperatures through physical sputtering, but this method is undesirable for semiconductor processing and integration into gate-conductor etching.

These problems illustrate that successful integration of Ni-containing metal gates into conventional CMOS technology requires ion-assisted plasma etching methods that allow anisotropic etching of the metal gates at low temperatures. In addition, it is important that these etching methods result in etching products that do not redeposit on the walls of the processing chamber.

Other Ni-containing materials that require low temperature etching methods include Ni—Fe layers which are important in magnetoresistive random access memory (MRAM) devices.

SUMMARY OF THE INVENTION

It is a primary object of the present invention to provide a plasma processing system and method for low temperature etching of a Ni-containing layer for manufacturing an integrated circuit. The process environment comprises process gases that are capable of anisotropic etching of high-aspect-ratio features.

A further object of the invention is to provide a method of etching a Ti—Ni layer using a gaseous plasma environment comprising hydrogen halide (HX) and carbonyl process gases.

The above and other objects are achieved, according to the present invention, by providing an apparatus and a method that uses a gaseous plasma environment comprising HX and carbonyl process gases. A nickel-containing layer on a substrate is exposed to plasma containing hydrogen halide and carbonyl process gases. The HX etching gas reacts with Ti in the metal alloy, forming $TiX_n$ reaction products that are removed from the substrate as a result of ion-assisted etching, and the carbonyl process gas reacts with the Ni in the metal alloy, forming a volatile nickel carbonyl ($Ni(CO)_4$) reaction product that is removed from the substrate. A passivating layer of $TiX_n$ is formed on feature sidewalls, which allows anisotropic etching in accordance with a mask pattern.

A further object of the invention is to provide a method for etching a Ni—Fe layer using a gaseous plasma environment comprising a carbonyl process gas.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

In general, the present invention pertains to a plasma processing method for etching a Ni-containing layer for manufacturing an integrated circuit.

In one embodiment, an apparatus and a method are provided for anisotropic etching of Ni-containing structures using a mixture of process gases. In the case of Ti—Ni alloys, anisotropic plasma etching in accordance with a mask pattern is achieved at low temperatures using a gaseous mixture comprising HX (where X can be a halide) and carbonyl (e.g., CO and $CO_2$) process gases.

The otherwise slow rates of removal of Ni-halides during plasma etching of Ti—Ni alloys using etch gases comprising halogens is addressed by introducing a mixture of etching gases that comprise HX and carbonyl gases. These gases are mostly non-reactive towards each other but react effectively with the components of the metal alloy, resulting in fast anisotropic etching.

Figure 1A:
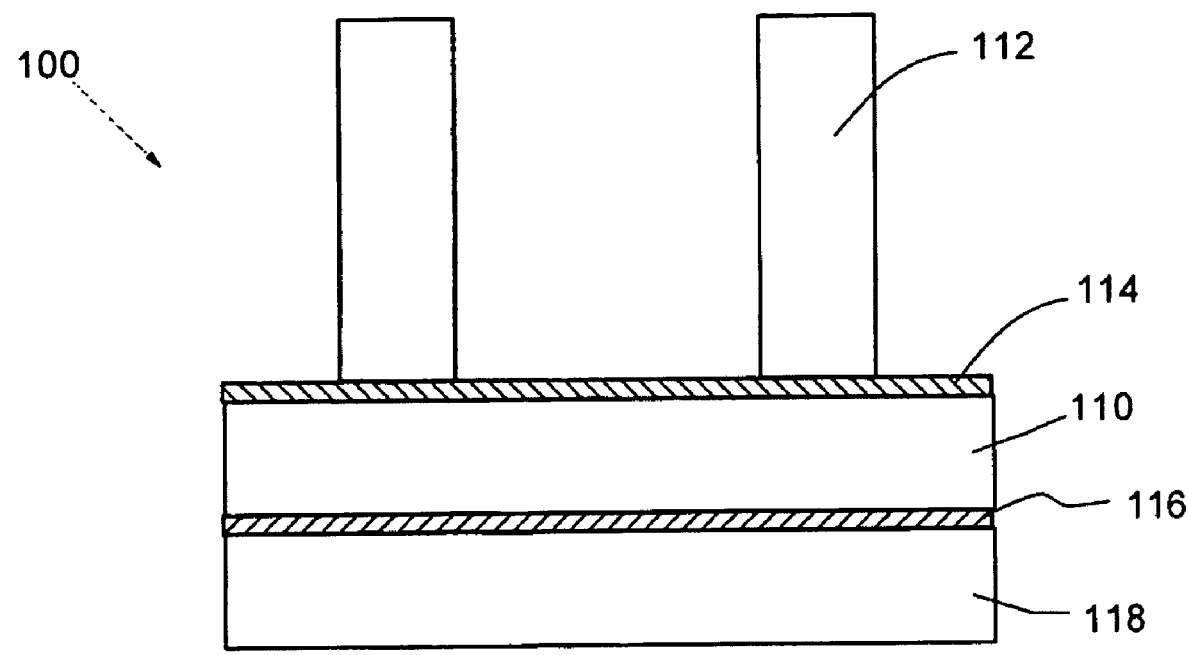
FIGS. 1a–1c show a schematic cross-sectional representation of a plasma etching method in accordance with the present invention.
Figure 1B:
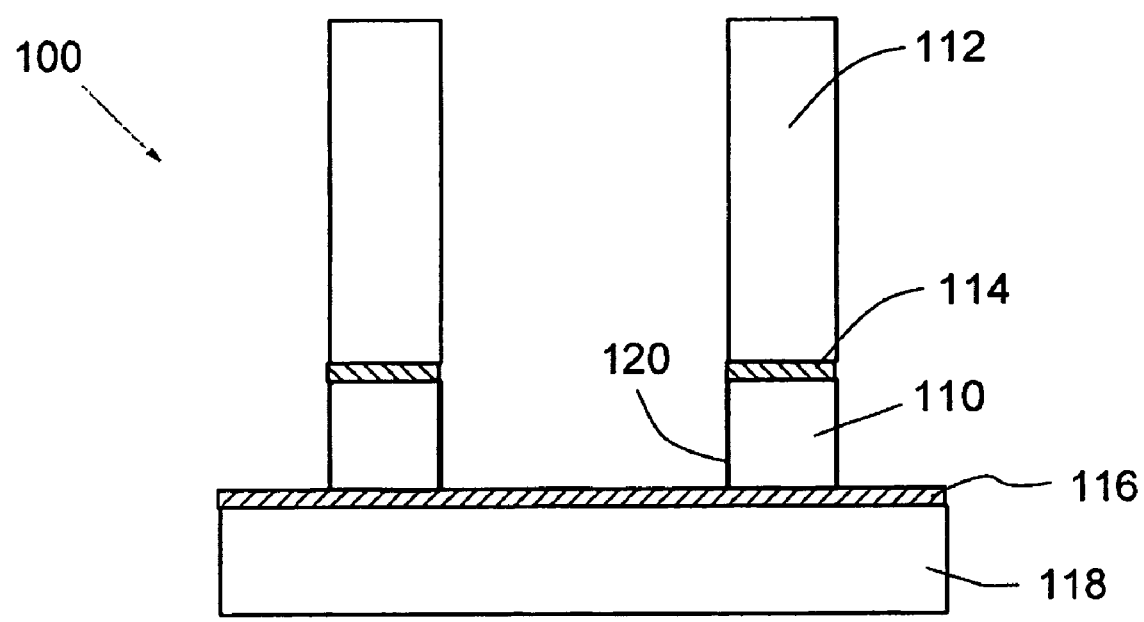
Figure 1C:
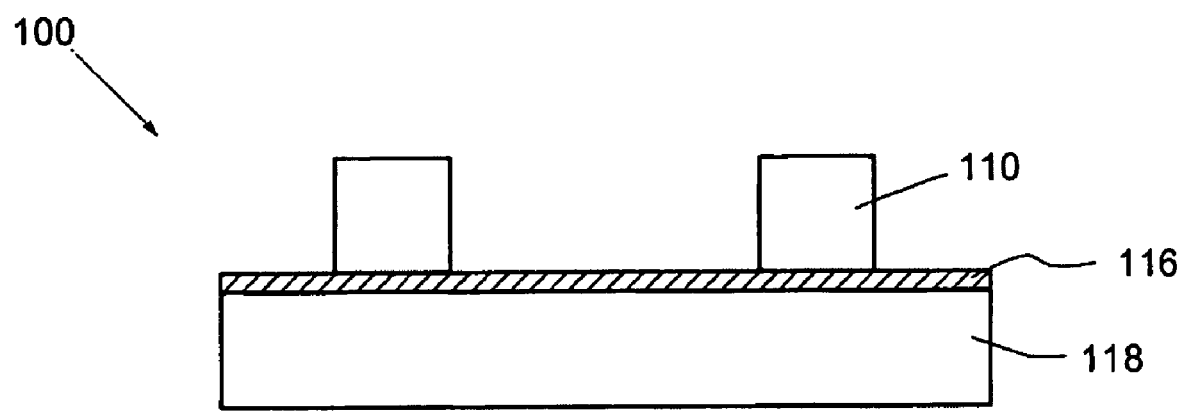

FIGS. 1a–1c show a schematic cross-sectional representation of a plasma etching process in accordance with the present invention.

FIG. 1a shows a partially completed integrated circuit. The segment 100 comprises a bulk-Si substrate 118, a layer of gate dielectric 116, a metal gate layer 110, an antireflection coating 114, and a photoresist pattern 112. Anisotropic etching of the structure in FIG. 1a according to the present invention etches the antireflective coating 114 and the metal alloy 110 while preserving the vertical geometry of the structure defined by the photoresist pattern 112, forming the structure shown in FIG. 1b. Referring to FIG. 1b, continued processing as is conventional in the art, removes the remaining photoresist pattern 112 and the antireflective coating 114, resulting in the structure shown in FIG. 1c.

A Ti—Ni metal gate layer is etched according to the present invention using HX and carbonyl process gases. The material removal proceeds via ion-assisted etching of Ti-halide ($TiX_n$) etch products and thermal desorption of nickel carbonyl ($Ni(CO)_4$) etch products. During anisotropic etching of the circuit features depicted in FIG. 1a, a passivating layer 120 containing an adsorbed $TiX_n$ reaction layer is formed on the side-walls of the partially etched Ti—Ni feature 110, where the ion-assisted etching of $TiX_n$ is very slow due to near absence of ion bombardment. The passivating layer 120 blocks further reaction of Ti and Ni on the sidewalls and leads to anisotropic etching of the feature 110. On horizontal surfaces depicted in FIG. 1a, the etching proceeds via ion-assisted $TiX_n$ etching and formation of volatile $Ni(CO)_4$.

In a preferred embodiment, the process gas includes a first gas containing a hydrogen halide and a second gas containing carbonyl gas. The hydrogen halide can be selected from the group containing hydrogen bromide (HBr), hydrogen chloride (HCl), and hydrogen iodide (HI). The carbonyl gas can be selected from the group containing carbon monoxide (CO) and carbon dioxide ($CO_2$).

The choice of halide for the HX process gas depends on plasma reactor type and process conditions. The HX must form a $TiX_n$ reaction layer that is etchable by ion-assisted desorption at a preferred temperature. For a given HX gas, if the process temperature is too low, excess passivation of the sidewall by $TiX_n$ can occur and lead to a tapered profile. If the process temperature is too high, the $TiX_n$ can desorb in the absence of ion bombardment from sidewall surfaces and this can lead to unacceptable undercutting of circuit features. HCl and HBr process gases have been shown to work well for substrate temperatures of about 80° C., but HI can require higher temperatures because the $TiI_n$ reaction product is less volatile than $TiBr_n$ or $TiCl_n$.

Dissociation of $CO_2$ into CO is followed by reaction of CO with Ni in the Ni-containing layer being etched. Embodiments using CO instead of $CO_2$ follow direct reaction with Ni without the $CO_2$ dissociation step.

In an alternate embodiment, an inert gas is added to any one of the aforementioned process gas chemistries. The inert gas may include at least one of argon, helium, xenon, krypton and nitrogen. For example, the addition of inert gas to the process chemistry is used to dilute the process gas or adjust the process gas partial pressure(s). Furthermore, for example, the addition of inert gas can aid the physical component of the feature etch.

Flow rates of the hydrogen halide and carbonyl gas can be independently controlled. Exemplary flow rates for each are from 0 to 1000 sccm, with typical values being less than 500 sccm and preferably between 1 and 500 sccm.

In an alternate embodiment of the present invention, Ni—Fe layers are etched in a plasma system comprising a carbonyl process gas. Etching proceeds via formation of volatile $Ni(CO)_4$ and $Fe(CO)_5$ etch products. An inert gas comprising at least one of argon, helium, xenon, krypton and nitrogen can be included in the process gas.

Figure 2:
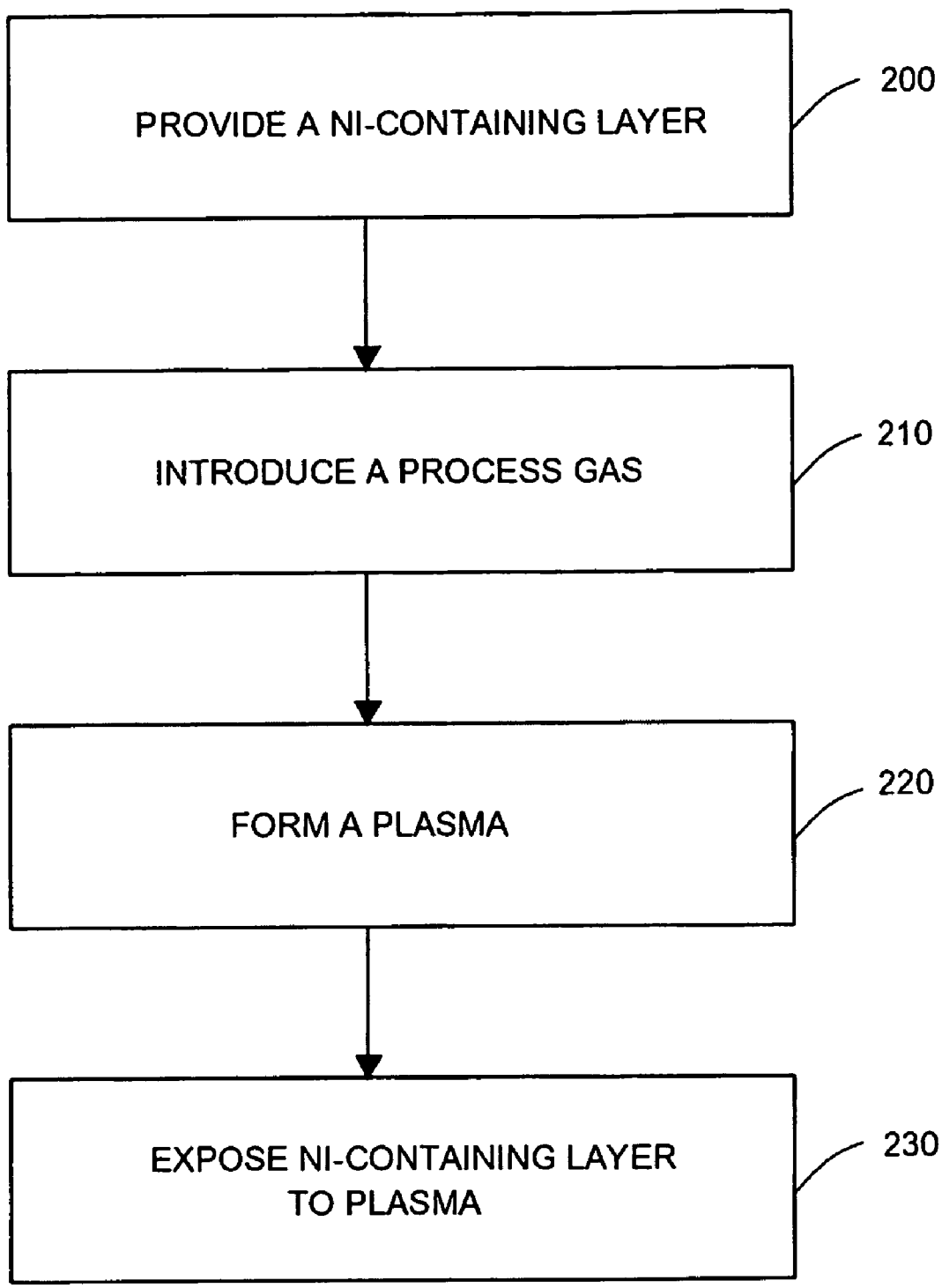
FIG. 2 is a flowchart for etching a Ni-containing layer according to the present invention.

FIG. 2 is a flowchart for etching a Ni-containing layer according the present invention. Step 200 provides a Ni-containing layer to be etched in a plasma process chamber. Process gases are introduced to the process chamber in step 210 and plasma is formed in step 220. The Ni-containing layer is exposed to the plasma in step 230 for a time period that enables etching of the Ni-containing layer.

Figure 3:
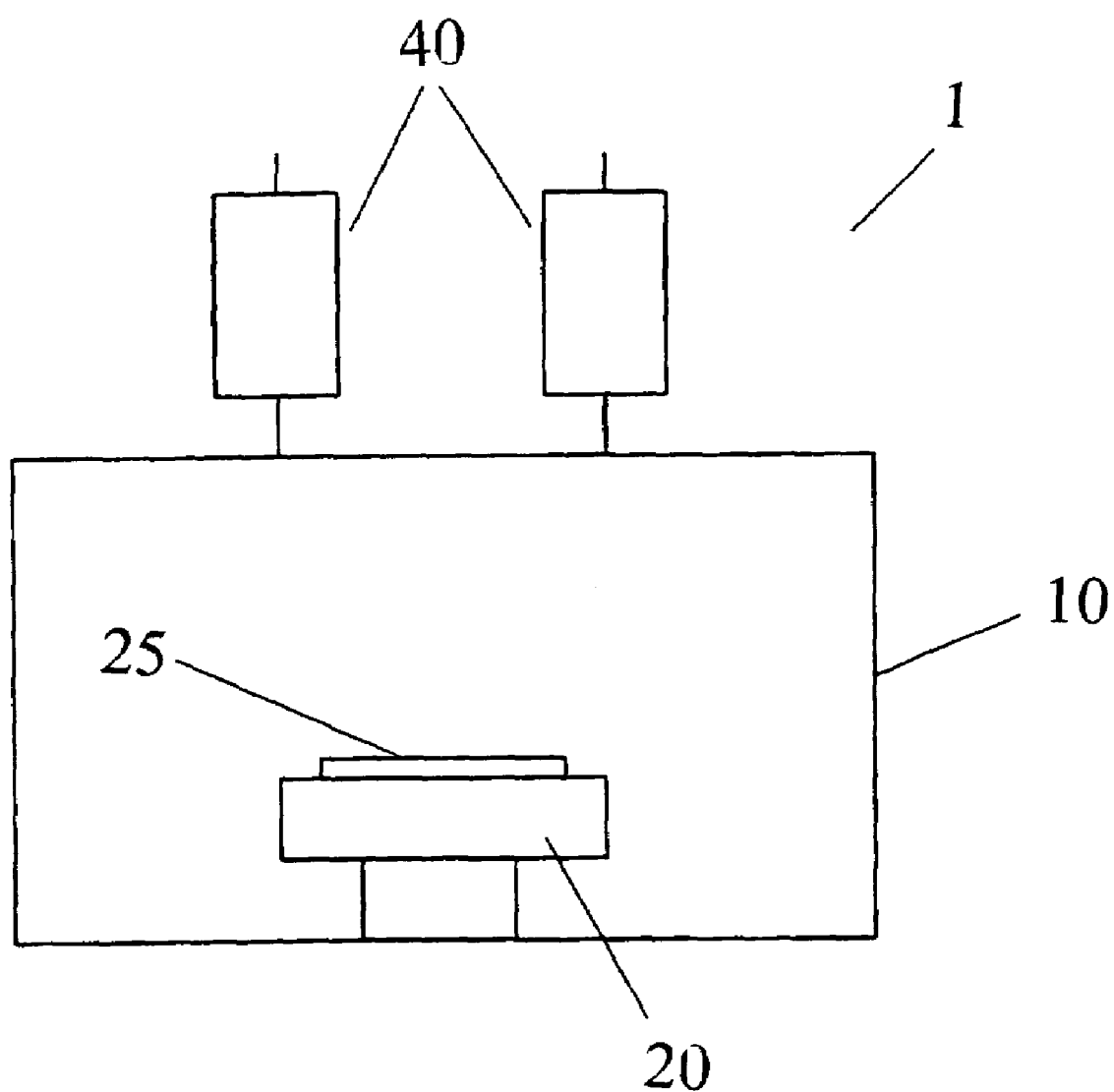
FIG. 3 shows a plasma processing system according to a preferred embodiment of the present invention.

FIG. 3 shows a plasma processing system according to a preferred embodiment of the present invention. A plasma processing system 1 that is capable of sustaining a plasma is depicted in FIG. 3, which includes a plasma process chamber 10, a substrate holder 20, upon which a substrate 25 to be processed is affixed, and a gas injection system 40 for introducing process gases to the plasma process chamber 10.

Figure 4:
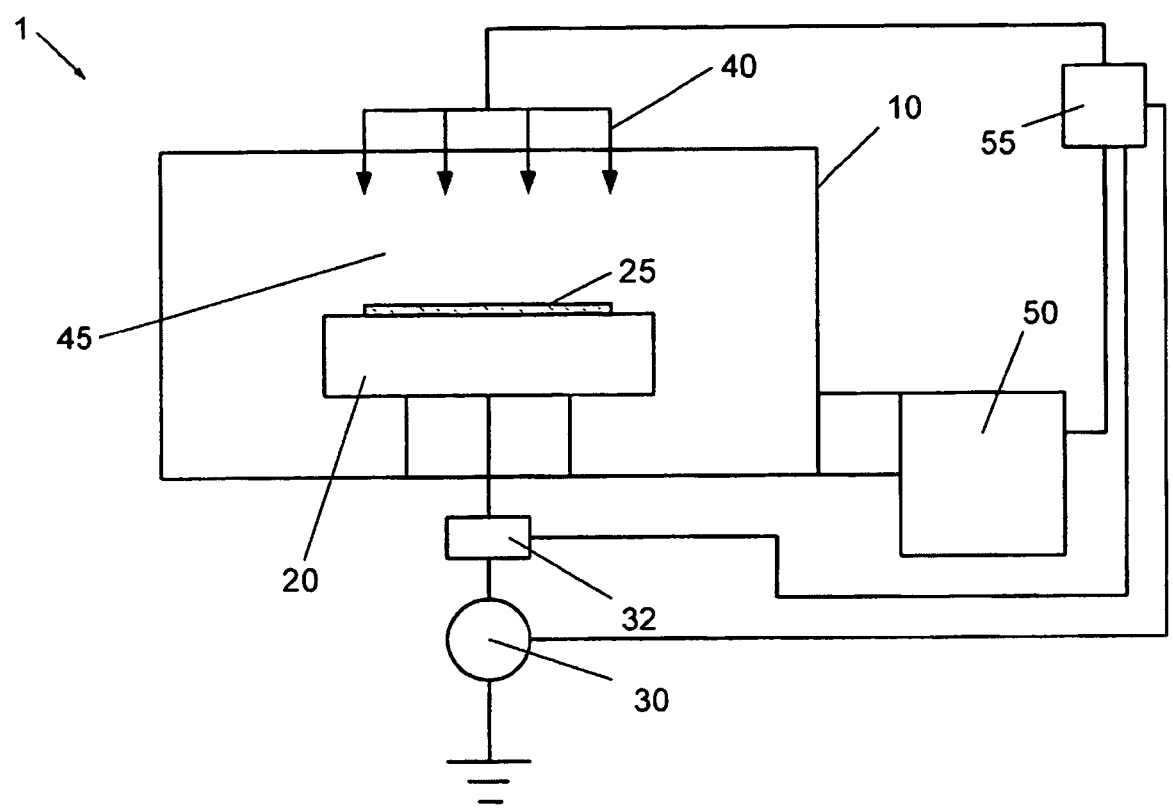
FIG. 4 shows a plasma processing system according to an alternate embodiment of the present invention.

FIG. 4 shows a plasma processing system according to an alternate embodiment of the present invention. A plasma processing device 1 is depicted which includes a chamber 10, a substrate holder 20, upon which a substrate 25 to be processed is affixed, a gas injection system 40, and a vacuum pumping system 50. Chamber 10 is configured to facilitate the generation of plasma in a processing region 45 adjacent a surface of substrate 25, wherein plasma is formed via collisions between heated electrons and an ionizable gas. An ionizable gas or mixture of gases is introduced via the gas injection system 40 and the process pressure is adjusted. For example, a gate valve (not shown) is used to throttle the vacuum pumping system 50. Desirably, plasma is utilized to create materials specific to a pre-determined materials process, and to aid either the deposition of material to a substrate 25 or the removal of material from the exposed surfaces of the substrate 25.

Substrate 25 is transferred into and out of chamber 10 through a slot valve (not shown) and chamber feed-through (not shown) via robotic substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers are included.

In the embodiment, shown in FIG. 4, the substrate holder 20 further serves as an electrode through which radio frequency (RF) power is coupled to plasma in the processing region 45. For example, the substrate holder 20 is electrically biased at a RF voltage via the transmission of RF power from an RF generator 30 through an impedance match network 32 to the substrate holder 20. The RF bias serves to heat electrons and, thereby, form and maintain plasma. In this configuration, the system operates as a reactive ion etch (RIE) reactor, wherein the chamber and upper gas injection electrode serve as ground surfaces. A typical frequency for the RF bias ranges from 1 MHz to 100 MHz and is preferably 13.56 MHz.

In an alternate embodiment, RF power is applied to the substrate holder electrode at multiple frequencies. Furthermore, the impedance match network 32 serves to maximize the transfer of RF power to plasma in processing chamber 10 by minimizing the reflected power. Match network topologies (e.g. L-type, π-type, T-type) and automatic control methods are known in the art.

With continuing reference to FIG. 4, a process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate (not shown).

Vacuum pump system 50 preferably includes a turbomolecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump are used.

A controller 55 includes a microprocessor, a memory, and a digital I/O port capable of generating control voltages sufficient to communicate and activate inputs to the plasma processing system 1 as well as monitor outputs from the plasma processing system 1. Moreover, the controller 55 is coupled to and exchanges information with the RF generator 30, the impedance match network 32, the gas injection system 40 and the vacuum pump system 50. A program stored in the memory is utilized to control the aforementioned components of a plasma processing system 1 according to a stored process recipe. One example of controller 55 is a DELL PRECISION WORKSTATION 610™, available from Dell Corporation, Dallas, Tex.

Figure 5:
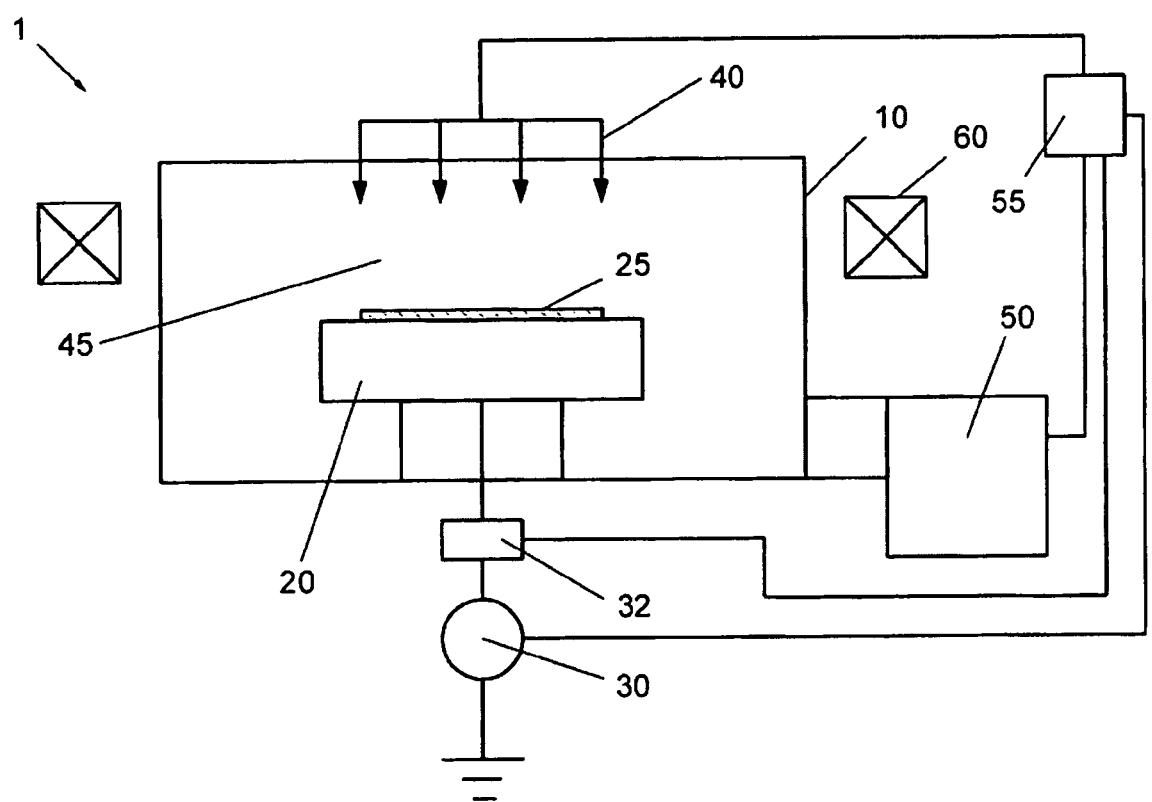
FIG. 5 shows a plasma processing system according to an alternate embodiment of the present invention.

FIG. 5 shows a plasma processing system according to an alternate embodiment of the present invention. The plasma processing system 1 further includes either a mechanically or electrically rotating DC magnetic field system 60, in order to potentially increase plasma density and/or improve plasma processing uniformity, in addition to those components described with reference to FIG. 4. Moreover, the controller 55 is coupled to the rotating magnetic field system 60 in order to regulate the speed of rotation and field strength.

Figure 6:
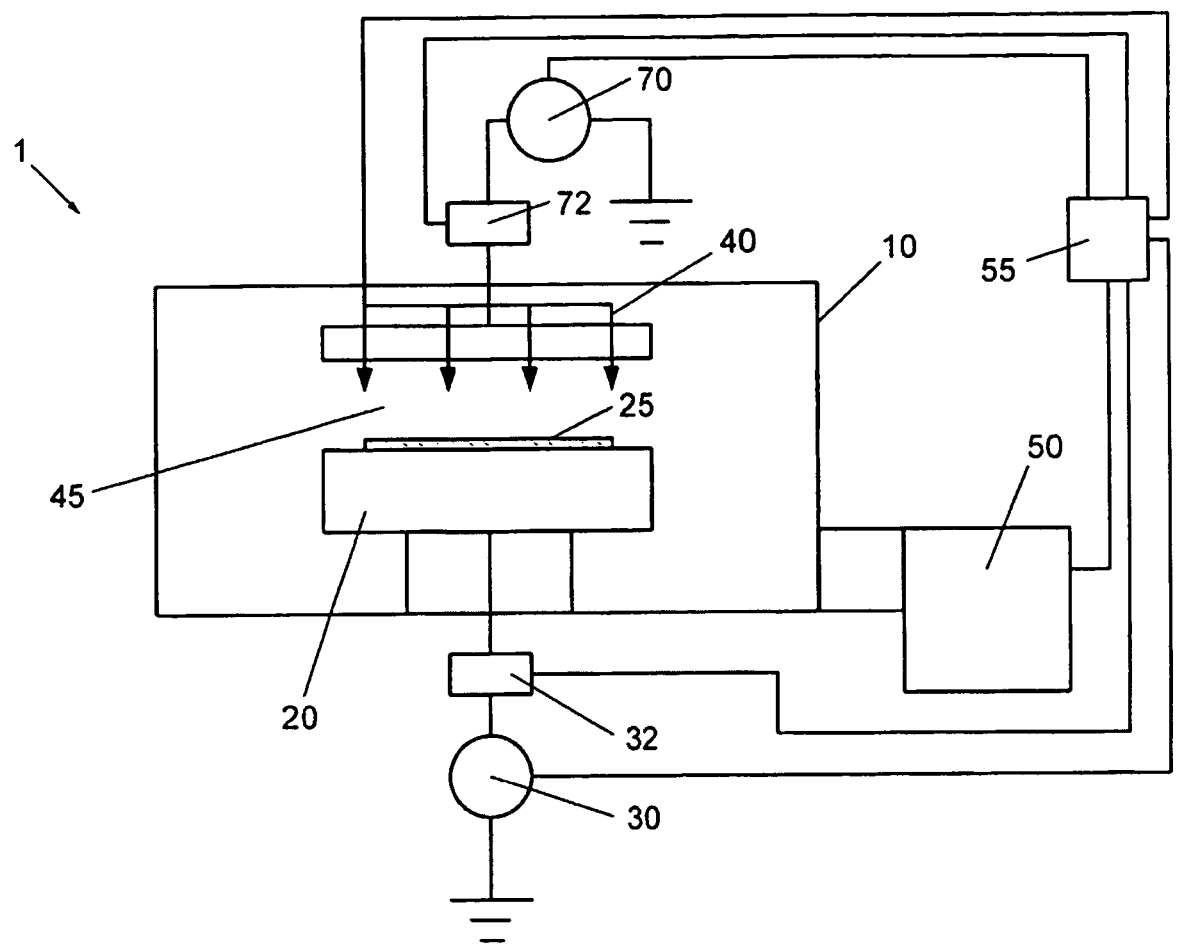
FIG. 6 shows a plasma processing system according to an alternate embodiment of the present invention.

FIG. 6 shows a plasma processing system according to an alternate embodiment of the present invention. The plasma processing system 1 of FIG. 4 further includes an upper plate electrode 70 to which RF power is coupled from an RF generator 72 through an impedance match network 74. A typical frequency for the application of RF power to the upper electrode ranges from 10 MHz to 200 MHz and is preferably 60 MHz. Additionally, a typical frequency for the application of power to the lower electrode ranges from 0.1 MHz to 30 MHz and is preferably 2 MHz. Moreover, the controller 55 is coupled to the RF generator 72 and the impedance match network 74 in order to control the application of RF power to the upper electrode 70.

Figure 7:
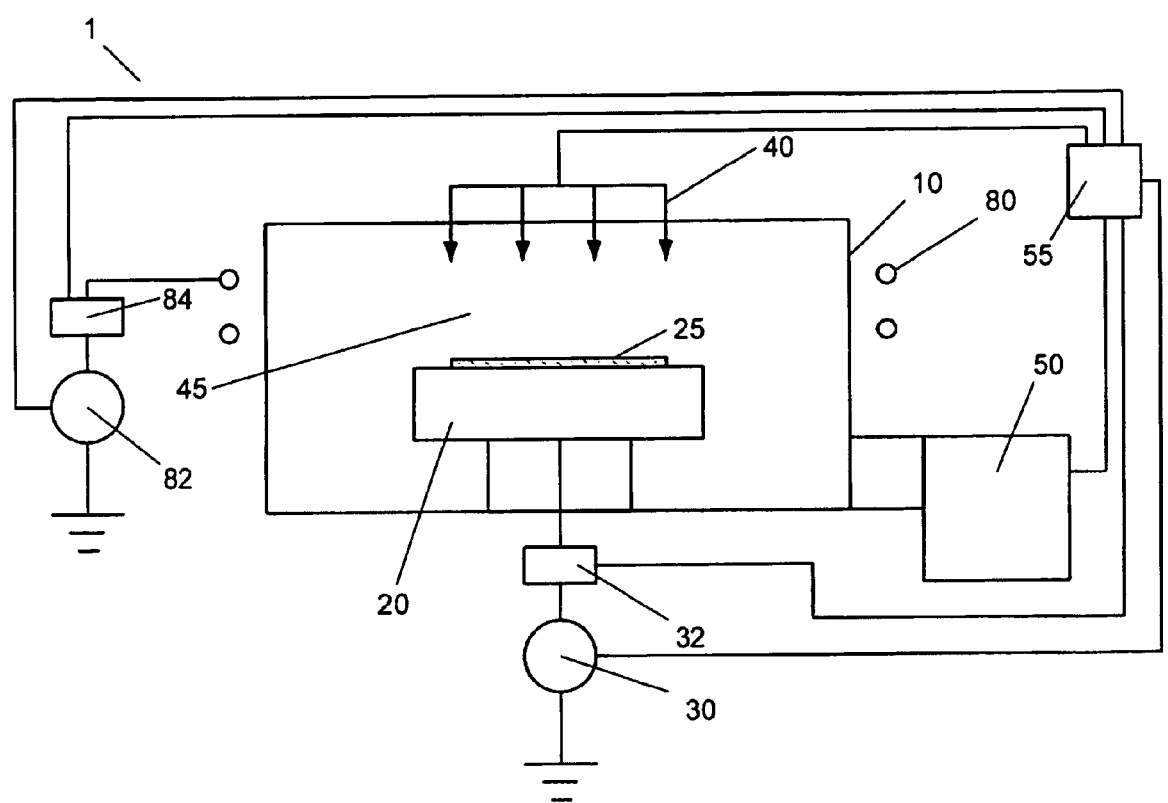
FIG. 7 shows a plasma processing system according to an alternate embodiment of the present invention.

FIG. 7 shows a plasma processing system according to an alternate embodiment of the present invention. The plasma processing system of FIG. 4 is modified to further include an inductive coil 80 to which RF power is coupled via an RF generator 82 through an impedance match network 84. RF power is inductively coupled from the inductive coil 80 through a dielectric window (not shown) to the plasma processing region 45. A typical frequency for the application of RF power to the inductive coil 80 ranges from 10 MHz to 100 MHz and is preferably 13.56 MHz. Similarly, a typical frequency for the application of power to the chuck electrode ranges from 0.1 MHz to 30 MHz and is preferably 13.56 MHz. In addition, a slotted Faraday shield (not shown) is employed to reduce capacitive coupling between the inductive coil 80 and plasma. Moreover, the controller 55 is coupled to the RF generator 82 and the impedance match network 84 in order to control the application of power to the inductive coil 80.

In an alternate embodiment, the plasma is formed using electron cyclotron resonance (ECR). In yet another embodiment, the plasma is formed from the launching of a Helicon wave. In yet another embodiment, the plasma is formed from a propagating surface wave.

It should be understood that various modifications and variations of the present invention may be employed in practicing the invention. It is therefore to be understood that, within the scope of the appended claims, the invention may be practiced otherwise than as specifically described herein.

The invention claimed is:

1. A method of processing a nickel-containing layer comprising:
   providing a nickel-containing layer overlying a substrate;
   introducing a process gas, said process gas comprising a carbonyl gas and a hydrogen halide gas;
   forming plasma from said process gas; and
   etching said nickel-containing layer by exposing said nickel-containing layer to said plasma, wherein
   said process gas reacts with said nickel-containing layer and etches completely through a portion of said nickel-containing layer to said substrate.

2. The method according to claim 1, wherein said substrate is maintained at a temperature of between 40° C. and 100° C.

3. The method according to claim 1, wherein said hydrogen halide comprises at least one of hydrogen bromide (HBr), hydrogen chloride (HCl) and hydrogen iodide (HI).

4. The method according to claim 1, wherein said carbonyl gas comprises at least one of carbon monoxide (CO) and carbon dioxide ($CO_2$).

5. The method according to claim 1, wherein said nickel-containing layer contains nickel and titanium.

6. The method according to claim 1, wherein said nickel-containing layer contains nickel and iron.

7. The method according to claim 1, wherein said process gas comprises HBr and CO.

8. The method according to claim 7, wherein a flowrate of HBr is less than 500 sccm and a flowrate of CO is less than 500 sccm.

9. The method according to claim 1, wherein said process gas comprises HBr and $CO_2$.

10. The method according to claim 9, wherein a flowrate of HBr is less than 500 sccm and a flowrate of $CO_2$ is less than 500 sccm.

11. The method according to claim 1, wherein said process gas comprises HCl and CO.

12. The method according to claim 11, wherein a flowrate of HCl is less than 500 sccm and a flowrate of CO is less than 500 sccm.

13. The method according to claim 1, wherein said process gas comprises HCl and $CO_2$.

14. The method according to claim 13, wherein a flowrate of HCl is less than 500 sccm and a flowrate of $CO_2$ is less than 500 sccm.

15. The method according to claim 1, wherein said process gas comprises HI and CO.

16. The method according to claim 15, wherein a flowrate of HI is less than 500 sccm and a flowrate of CO is less than 500 sccm.

17. The method according to claim 1, wherein said process gas comprises HI and $CO_2$.

18. The method according to claim 17, wherein a flowrate of HI is less than 500 sccm and a flowrate of $CO_2$ is less than 500 sccm.

19. The method according to claim 1, wherein said process gas also comprises an inert gas.

20. The method according to claim 19, wherein said inert gas comprises at least one of argon, helium, xenon and nitrogen.

* * * * *